(12) United States Patent
Okazaki et al.

(10) Patent No.: US 6,741,142 B1
(45) Date of Patent: May 25, 2004

(54) HIGH-FREQUENCY CIRCUIT ELEMENT HAVING MEANS FOR INTERRUPTING HIGHER ORDER MODES

(75) Inventors: Yasunao Okazaki, Shiga (JP); Akira Enokihara, Nara (JP); Kentaro Setsune, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/523,132

(22) Filed: Mar. 10, 2000

(30) Foreign Application Priority Data

Mar. 17, 1999 (JP) ............................ 11-071644

(51) Int. Cl.7 ............................ H01P 3/08; H01B 12/02
(52) U.S. Cl. ..................... 333/99 S; 333/204; 333/246
(58) Field of Search ........................ 333/246, 232, 333/251, 204, 219, 995

(56) References Cited

U.S. PATENT DOCUMENTS

| | | | | |
|---|---|---|---|---|
| 3,638,148 A | * | 1/1972 | Hallford et al. | ............. 333/246 |
| 4,268,803 A | * | 5/1981 | Childs et al. | ............ 333/246 X |
| 4,713,634 A | * | 12/1987 | Yamamura | .................. 333/245 |
| 5,030,935 A | * | 7/1991 | Williams et al. | ............. 333/246 |
| 5,164,358 A | * | 11/1992 | Buck et al. | ............. 333/995 X |
| 5,222,294 A | * | 6/1993 | Torkington et al. | ....... 333/12 X |
| 5,274,340 A | * | 12/1993 | Deki et al. | .............. 333/246 X |

FOREIGN PATENT DOCUMENTS

| | | | | |
|---|---|---|---|---|
| JP | 263702 | * | 10/1989 | .................. 333/251 |
| JP | 4099703 | * | 2/1992 | .................. 333/247 |
| JP | 5007101 | * | 1/1993 | ................ 333/99 R |

* cited by examiner

Primary Examiner—Benny T. Lee
(74) Attorney, Agent, or Firm—Merchant & Gould P.C.

(57) ABSTRACT

A high-frequency circuit element including a substrate, a high-frequency circuit formed on the substrate, a metal box electromagnetically shielding the high-frequency circuit by enclosing the substrate and an input/output terminal placed on the metal box and inputting/outputting a high-frequency signal to/from the high-frequency circuit. Adding at least one plate for interrupting unwanted higher-order mode cutting off the propagation path of the high frequency waves in the space inside the metal box by substantially dividing the space inside the metal box makes it possible to cut off the propagation path where the high frequency waves propagates in the space inside the box and to suppress excitation and propagation of the unwanted higher-order mode that adversely affects the frequency characteristic of the high frequency circuit element.

11 Claims, 10 Drawing Sheets

HIGH-FREQUENCY CIRCUIT ELEMENT HAVING MEANS FOR INTERRUPTING HIGHER ORDER MODES

FIELD OF THE INVENTION

The present invention relates to a high-frequency circuit element, such as a filter, etc., used for a high-frequency signal processor in communication systems, etc.

BACKGROUND OF THE INVENTION

In high-frequency communication systems, a high-frequency circuit element such as a filter, a branching filter, or the like, is an essential component. Many of conventional high-frequency circuit elements, such as resonator filters, etc. have a structure that is electromagnetically shielded by enclosing a resonator in a metal box in order to prevent the radiation of electromagnetic field energy and the entrance of electromagnetic noise from the outside.

FIGS. 7 and 8 respectively show one example of a conventional high-frequency circuit element using a transmission line structure. In FIG. 7, a box lid 81 shown in FIG. 8 is omitted so that the internal structure of the box of the high-frequency circuit element can be seen.

As shown in FIG. 8, in the conventional high-frequency circuit element, λ/2 resonators 86a, 86b, 86c, 86d of a strip conductor pattern and input/output lines 87a, 87b are formed on the surface of the subtrate 85 made of dielectric monocrystal, or the like. The high-frequency circuit having a microstrip structure is fabricated from λ/2 resonators 86a, 86b, 86c, 86d, input/output lines 87a, 87b and a ground plane 88. This high-frequency circuit includes four coupled λ/2 resonators and functions as a four-stage band pass filter.

The box of the high-frequency circuit element is formed of a conductor material and includes, as shown in FIG. 8, a box frame 82(also see FIG. 7) and a box bottom 83(also see FIG. 7). A substrate 85(see FIG. 7) is fixed to the box bottom 83 with, for example, conductive adhesives so that the box is electrically connected to the ground plane 88.

On the side face of the box frame 82, input/output terminals 84a, 84b(also see FIG. 7) having a coaxial connector are placed. Inner conductors of the input/output terminals 84a, 84b are electrically connected to the input/output lines 87a, 87b and outer conductors of the input/output terminals 84a, 84b are electrically connected to the box, respectively.

FIGS. 9 and 10 respectively show another example of a conventional high-frequency circuit element using a strip conductor pattern. Also in FIG. 97, a box lid 81 shown in FIG. 10 is omitted so that the internal structure of the box of the high-frequency circuit element can be seen. In the configuration shown in FIG. 10, eight hairpin resonators 89a, 89b, 89c, 89d, 89e, 89f, 98g, 86h are used so as to form an eigth-stage band pass filter. The structure of the other parts is the same as the conventional high-frequency circuit element shown in FIGS. 7 and 8 and will not be further described.

When inputting a high-frequency signal from, for example, the input/output terminal 84a in the conventional high-frequency circuit elements having the structure mentioned above, as shown in FIG. 11, electromagnetic waves in a quasi-TEM mode, i.e. a fundamental mode propagate through the input/output line 87a that is a microstrip conductor transmission line. FIG. 11 is a cross-sectional view showing the box, which is cut along the plane perpendicular to the input/output line 87a. FIG. 11 schematically shows the directions of the electric fields based on the analysis results of a three-dimensional electromagnetic field simulation (HFSS manufactured by Hewlett Packard Company).

The electromagnetic waves in the quasi-TEM mode propagating though the input/output line 87a cause resonance phenomena in each resonator 86a–86d or 89a–89h, thus functioning as a band pass filter. Therefore, only an in-band signal of the filter passes through between the input/output lines 87a and 87b and is output therefrom.

However, in the conventional high-frequency circuit element mentioned above, not only the quasi-TEM mode in which electromagnetic waves propagate through the strip conductor transmission line is excited, but also a waveguide mode is excited due to discontinuity in the converting part from the input/output terminals 84a, 84b to the input/output lines 87a, 87b, as well as due to the component of the radiation electric field caused by the quasi-TEM mode, as shown in FIG. 12. The wave guide mode is an unwanted higher-order mode, in which electromagnetic waves propagate through the space between the box lid 81 and the substrate 85. As a result, the frequency characteristic of the high-frequency circuit element is adversely affected. Similarly to FIG. 11, FIG. 12 is a cross-sectional view showing the box, which is cut along the plane perpendicular to the input/output line 87a, and illustrating the analysis result of the three-dimensional electromagnetic field simulation.

Unlike the quasi-TEM mode, since such a waveguide mode is not under the influence of the filter function, electromagnetic waves propagate in regardless of the passband of the filter, thus deteriorating the characteristic of the high-frequency circuit element as a filter. Particularly, there arise some problems, for example, the decrease in attenuation in a rejection band, i.e., the increase in the background level, the deterioration of capability of rejecting out-of-band signals of the filter.

In order to reduce the influence of the waveguide mode (unwanted higher-order mode), the box may be designed so that the cutoff frequency in the space between the box lid 81 and the substrate 85 is set to be sufficiently higher than the center frequency of the filter. However, great attenuation, for example, –80 dB or less is required in the rejection band and so the propagation of only a few high-frequency signals may cause a problem. Consequently, a solution only by designing the box taking into account the cutoff frequency is not sufficient.

Such a problem becomes further significant when it is necessary to miniaturize a high-frequency circuit element, to increase an operation frequency or to use a material such as a superconductive conductor having a large conductivity, in order to reduce a loss.

SUMMARY OF THE INVENTION

It is an object of the present invention to solve the problems of the prior art mentioned above. That is, the object of the present invention is to provide a high performance high-frequency circuit element capable of suppressing the generation of an unwanted higher-order mode in the space inside the metal box of the high-frequency circuit element and having an excellent frequency characteristic.

In a basic configuration, a high-frequency circuit element according to the present invention includes a substrate, a high-frequency circuit formed on the substrate, a metal box electromagnetically shielding the high-frequency circuit by enclosing the substrate, an input/output terminal placed on the metal box and inputting/outputting a high-frequency signal to/from the high-frequency circuit, and at least one shielding element for interrupting an unwanted higher-order mode by suppressing the propagation of high frequency waves between the input-output terminals.

In a first specific configuration, a high-frequency circuit element according to the present invention includes a substrate, a high-frequency circuit formed on the substrate, a metal box electromagnetically shielding the high-frequency circuit by enclosing the substrate, an input/output terminal placed on the metal box and inputting/outputting a high-frequency signal to/from the high-frequency circuit, and at least one plate for interrupting an unwanted higher-order mode substantially dividing an internal space of the metal box and cutting off the propagation path for the high-frequency waves in the internal space of the metal box.

According to such a configuration, having the plate for interrupting an unwanted higher-order mode, it is made possible to suppress the propagation of the electromagnetic waves in a waveguide mode generated in the space inside the box so as to prevent the deterioration of the frequency characteristic due to excitation of the unwanted higher-order mode. Therefore, it is possible to provide a high performance high-frequency circuit element having an excellent frequency characteristic.

It is desirable in the above-mentioned configuration that the plate for interrupting an unwanted higher-order mode is made of a conductor. Thus, the effect of suppressing the propagation of the unwanted higher order mode can be improved, because the conductor does not transmit electromagnetic waves. In such a configuration, it is desirable that the plate for interrupting an unwanted higher-order mode made of a conductor is electrically connected to the metal box. Thus, the plate for interrupting an unwanted higher-order mode made of a conductor functions as an electric wall with respect to the electromagnetic waves, so that the effect of suppressing the propagation of the unwanted higher-order mode can be enhanced further.

Furthermore, in the above-mentioned first specific configuration, it is desirable that the plate for interrupting an unwanted higher-order mode is made of a dielectric having a high dielectric constant. Thereby, electromagnetic waves are reflected from or absorbed by the dielectric and cannot pass through the plate. Consequently, the effect of suppressing the propagation of the unwanted higher-order mode can be enhanced.

It is desirable in the first specific configuration that the plate for interrupting an unwanted higher-order mode is placed spanning over and approximately perpendicular to at least one input/output line of the high-frequency circuit and placed so that it is not in an electric contact with the input/output line. Thereby, the connection portion where the input/output terminal is connected to the input/output line is isolated from the main circuit part, such as a resonator, of the high-frequency circuit. Consequently, it is possible to prevent the electromagnetic waves of the unwanted higher-order mode, which are excited due to the discontinuity of the connection portion, from adversely affecting the high-frequency circuit. It is desirable in this configuration that the plate for interrupting an unwanted higher-order mode has a cut-out so that it is not in electric contact with the input/output lines of the high-frequency circuit. Thereby, the lower end of the plate can be extended to the position that is in contact with the substrate in a place where the high-frequency circuit element is not provided. Consequently, the effect of suppressing the unwanted higher-order mode can further be enhanced.

According to the second specific configuration of the high-frequency circuit element according to the present invention, the high-frequency circuit element includes a substrate, a high-frequency circuit formed on the substrate, a metal box electromagnetically shielding the high-frequency circuit by enclosing the substrate, an input/output terminal placed on the metal box and inputting/outputting a high-frequency signal to/from the high-frequency circuit, and at least one cover for interrupting an unwanted higher-order mode covering at least one input/output line of the high-frequency circuit in an internal space of the metal box and suppressing the propagation of high-frequency waves.

According to such a configuration, having the cover for interrupting an unwanted higher-order mode makes it possible to suppress the propagation of the electromagnetic waves in a waveguide mode generated in the space inside the box so as to prevent the deterioration of the frequency characteristic due to excitation of the unwanted higher-order mode. Therefore, it is possible to provide a high performance high-frequency circuit element having an excellent frequency characteristic.

It is desirable in the second specific configuration that the cover for interrupting an unwanted higher-order mode is made of a conductor. Thus, the effect of suppressing the propagation of the unwanted higher-order mode is enhanced, because the conductor does not transmit electromagnetic waves. It is desirable in this configuration that the cover for interrupting an unwanted higher-order mode made of a conductor is electrically connected to the metal box. Thus, the cover for interrupting an unwanted higher-order mode functions as an electric wall with respect to electromagnetic waves. Consequently, it is possible further to enhance the effect of suppressing the propagation of the unwanted higher-order mode.

It is desirable in the second specific configuration that the cover for interrupting an unwanted higher-order mode is made of a dielectric having a high dielectric constant. Thus, electromagnetic waves are reflected from or absorbed by the dielectric and cannot pass through the cover, so that the effect of suppressing the propagation of the unwanted higher-order mode can be enhanced.

It is desirable in the first and second specific configurations that the high-frequency circuit is a high-frequency filter. Thus, excitation of the unwanted higher-order mode is suppressed by the plate or cover for interrupting an unwanted higher-order mode. Consequently, it is possible to prevent the higher-order mode in the out-of-band frequency, which is not rejected by the filter, from propagating and being output. Therefore, the filter having an excellent out-of-band attenuation characteristic can be attained. In this configuration, it is desirable that the high-frequency filter has a plurality of coupled planar circuit resonators. Thus, it is possible to prevent the unwanted higher-order mode excited by the radiation from the resonators from inputting from the input/output line and outputting from the input/output terminal. Consequently, it is possible to prevent the higher-order mode in the out-of-band frequency that is not rejected by the filter from propagating and being output. Therefore, it is possible to attain a filter having an excellent out-of-band attenuation characteristic.

Furthermore, in the first and second specific configurations, it is desirable that the high-frequency circuit is a superconductor filter. Thus, it is possible to radically reduce the conductor loss at the resonator, so that low loss and a steep skirt can be attained.

DETAILED DESCRIPTION OF THE INVENTION

Hereinafter, the present invention will be described by way of embodiments with reference to drawings.

First Embodiment

Figure 1:
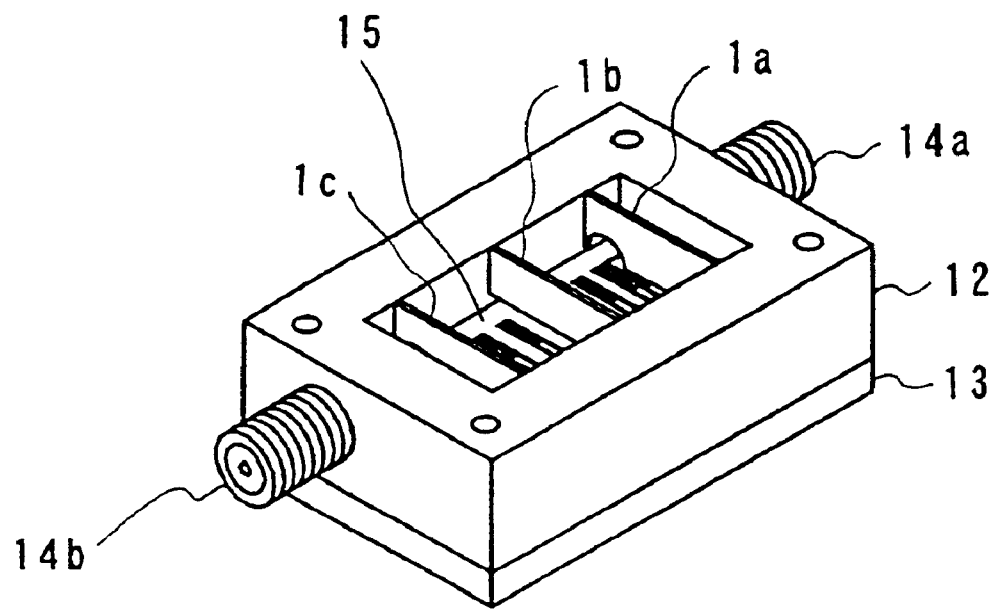
FIG. 1 is a perspective view showing a schematic structure of a high-frequency circuit element according to a first embodiment of the present invention.
Figure 2:
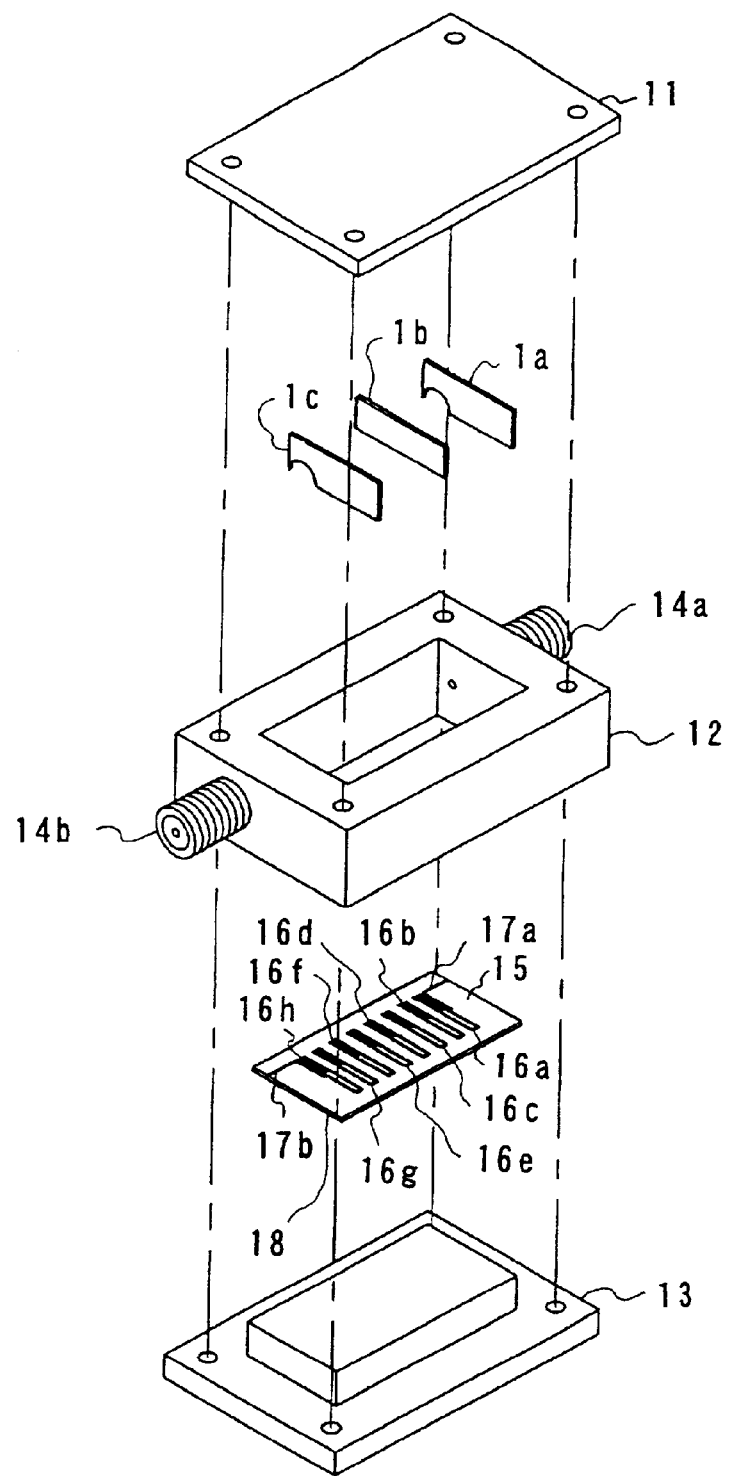
FIG. 2 is an exploded perspective view showing a high-frequency circuit element according to the first embodiment of the present invention.

FIGS. 1 and 2 respectively show a schematic structure of a high-frequency circuit element according to a first embodiment of the present invention. In FIG. 1, a box lid 11 shown in FIG. 2 is omitted so that the internal structure of the box can be seen.

As shown in FIG. 2, in a high-frequency circuit element of this embodiment, hairpin resonators 16a, 16b, 16c, 16d, 16e, 16f, 16g, 16h of a strip conductor pattern and input/output lines 17a, 17b are formed on the surface of the substrate 15 made of a dielectric monocrystal, or the like. The high-frequency circuit having a microstrip structure is fabricated from these hairpin resonators 16a, 16b, 16c, 16d, 16e, 16f, 16g, 16h, input/output lines 17a, 17b and a ground plane 18. This high-frequency circuit includes eight coupled hairpin resonators and functions as an eight-stage band pass filter.

The high-frequency circuit element has a box for enclosing and electromagnetically shielding the above-mentioned high-frequency circuit. The box is formed of a conductor material and includes, as shown in FIG. 2, a box lid 11, a box frame 12 and a box bottom 13. A substrate 15 is fixed to the box bottom 13 with, for example, conductive adhesives so that the box is electrically connected to the ground plane 18.

On the side face of the box frame 12, input/output terminals 14a, 14b having a coaxial connector are mounted. Inner conductors of the input/output terminals 14a, 14b are electrically connected to the input/output lines 17a, 17b and outer conductors of the input/output terminals 14a, 14b are electrically connected to the box frame 12, respectively.

Furthermore, as shown in FIGS. 1 and 2 the high-frequency circuit element of this embodiment has plates 1a, 1b, 1c for interrupting an unwanted higher-order mode made of a conductor material. The plates 1a, 1b, 1c are fixed to the box frame 12 with, for example, conductive adhesives so as to be electrically connected to the box. Thus, the plates cut off a propagation path for high-frequency waves by approximately or substantially dividing the internal space of the box.

Of the plates 1a–1c, the plate 1b located in the middle is placed between the hairpin resonators 16a and 16h. Therefore, the plate 1b is fixed to the box frame 12 at a certain gap with respect to the substrate 15 so that it is not in contact with the strip conductor (hairpin resonators 16a–16h) of the high-frequency circuit.

In the meantime, the plates 1a, 1c located on both sides are respectively placed in the outer side of each hairpin resonator 16a, 16h. That is, the plates 1a, 1c are placed spanning over the input/output lines 17a, 17b. In order to do so, each plate 1a, 1c has a semicircular cut-out. The lower end of each plate 1a, 1c except for the cut-out is placed closely to the surface of the substrate 15 without a gap between the substrate 15 and the lower end of the plates.

It is preferable that the plates 1a, 1c are placed approximately perpendicularly to the input/output lines 17a, 17b. Thereby, connection portions at which the input/output terminals 14a, 14b are connected to the input/output lines 17a, 17b are isolated from the hairpin resonators 16a and 16h that are the main circuit of the high-frequency circuit. Consequently, it is possible to prevent the electromagnetic waves in the unwanted higher-order mode, which are excited due to the discontinuity of the connection portion, from adversely affecting the high-frequency circuit.

According to the configuration in which the plates 1a–1c made of a conductor material are electrically connected to the box frame 12, the plates 1a–1c function as electric walls with respect to electromagnetic waves, thus improving the effect of suppressing the propagation of the unwanted higher-order mode.

The plates 1a–1c can be formed of a dielectric having a high dielectric constant. In this case, since electromagnetic waves are reflected from or absorbed by the dielectric and cannot pass through the plates 1a–1c, the effect of suppressing the propagation of the unwanted higher-order mode can be enhanced. As the dielectric constant is higher, the reflection coefficient increases and the above-mentioned effect is enhanced. It is particularly preferable that when the dielectric having a high dielectric constant is about 10 or more, the reflection coefficient on the dielectric boundary becomes about 0.5 or more and the significant effect can be attained.

Next, the operation of the high-frequency circuit element as mentioned above of this embodiment will be explained.

Figure 11:
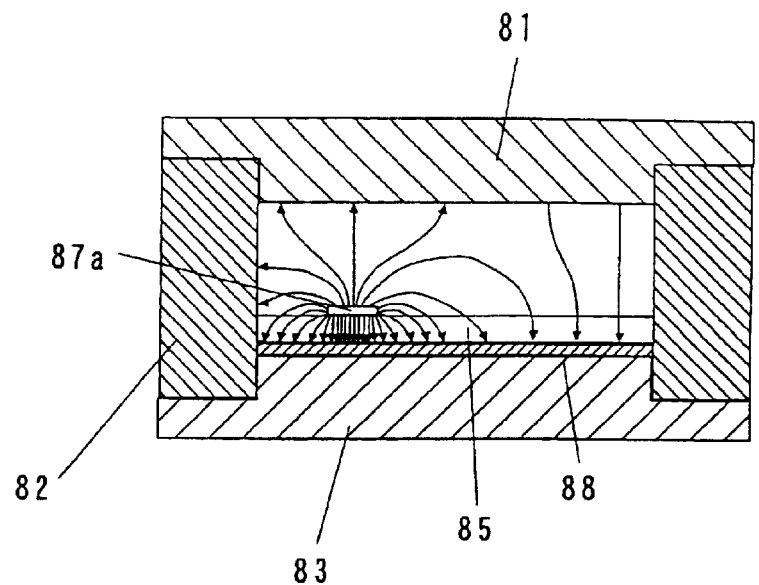
FIG. 11 is an explanatory view illustrating the propagation of electromagnetic waves in a quasi-TEM mode.

When the input/output terminal 14a is an input side and the input/output terminal 14b is an output side, the high-frequency signal from the input/output terminal 14a is converted from a TEM mode, which is a fundamental mode for the coaxial transmission line, to a quasi-TEM mode, which is a fundamental mode of the microstrip line (see FIG. 11); then propagates along the input/output line 17a; and enters the high-frequency circuit.

The high-frequency circuit functions as a band pass filter when each of the hairpin resonators 16a–16h effect the resonance phenomenon. Therefore, only signals in the frequency band corresponding to a passband of the bandpass filter are output to the input/output line 17b in a quasi-TEM mode; converted into the TEM mode again; and then outputted from the input/output terminal 14b.

Moreover, the box including the box lid 11, the box frame 12 and the box bottom 13 has a role of preventing the loss of electromagnetic energy due to the radiation of high-frequency signals from the input/output lines 17a, 17b and the microstrip conductor (the hairpin resonators 16a–16h) constituting the high frequency circuit, and the entrance of electromagnetic noise from the outside.

Figure 12:
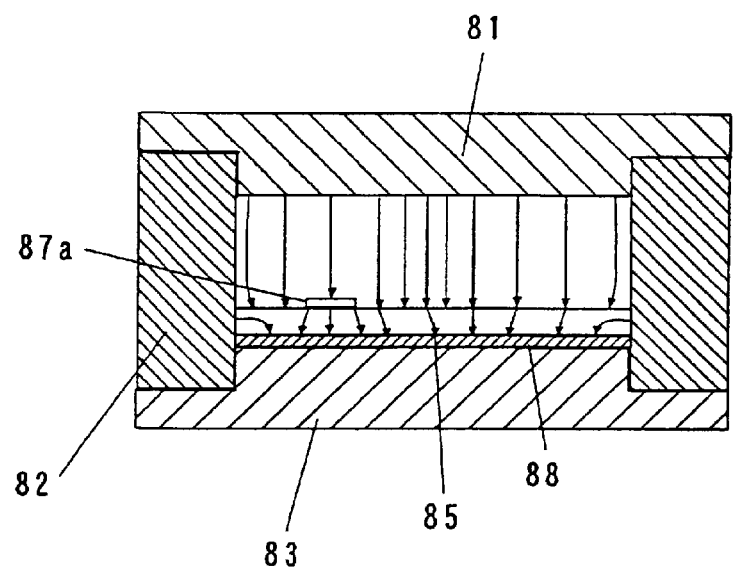
FIG. 12 is an explanatory view illustrating the propagation of electromagnetic waves in a waveguide mode.

As mentioned above, the high-frequency circuit element functions in a fundamental mode of the microstrip conductor. However, it is necessary to prevent the generation of a waveguide mode (see FIG. 12) which is one of the unwanted higher-order modes other than the fundamental mode and which propagates through the box as a rectangular waveguide. Such a waveguide mode is generated due to the conversion in the propagation mode caused during the transmission from the input/output terminal 14a to the input/output line 17a or the radiation of electromagnetic waves from the microstrip conductor.

Therefore, in the high-frequency circuit element of this embodiment, the plates 1a–1c function as electric walls with respect to the electromagnetic waves propagating in the space between the substrate 15 and the box. Thus, it is possible to prevent the propagation of such electromagnetic waves in the unwanted higher-order mode.

A comparative experiment was carried out in order to investigate the effects of the plates 1a–1c. The results are explained with reference to FIGS. 3 and 4.

First, in order to start the comparative experiment, the high-frequency circuit element of this embodiment was produced under the following conditions.

For the substrate 15, $LaAl_2O_3$ was used, which was a dielectric of a high dielectric constant, having a length of the narrow side of 12.7 mm, a length of the longer side of 25.4 mm, a thickness of 0.5 mm and a dielectric constant of 24. A ground plane 18 was formed on one surface of the substrate by vapor-depositing a superconductive conductor, YBCO. Furthermore, on the other surface of the substrate 15, the 0.5 mm-width input/output lines 17a, 17b and hairpin resonators 16a–16h designed as band pass filters having a center frequency of 1.9 GHz were formed by vapor deposition, etching, and the like, also by the use of a superconductive conductor, YBCO.

The box was formed by mechanically processing brass and gold-plating the surface thereof. The box had an outside size of 37.8 mm×25.1 mm×15 mm and an inside size of 25.6 mm×12.9 mm×4.1 mm.

The plates 1a, 1c were formed by mechanically processing brass and gold-plating the surface thereof. Each of the plates 1a, 1c had a length of the longer side of 12.9 mm, a length of the narrow side of 3.6 mm, a thickness of 0.3 mm and a radius of the cut-out of 2 mm.

The plate 1b was formed by mechanically processing brass and gold-plating the surface thereof. The plate 1b had a length of the longer side of 12.9 mm, a length of the narrow side of 3.3 mm, and a thickness of 0.3 mm.

The plates 1a, 1c were respectively placed 3 mm apart from the inner surfaces of the box on which the input/output terminals 14a, 14b were respectively placed. The plate 1b was placed between the plates 1a, 1c.

Figure 3:
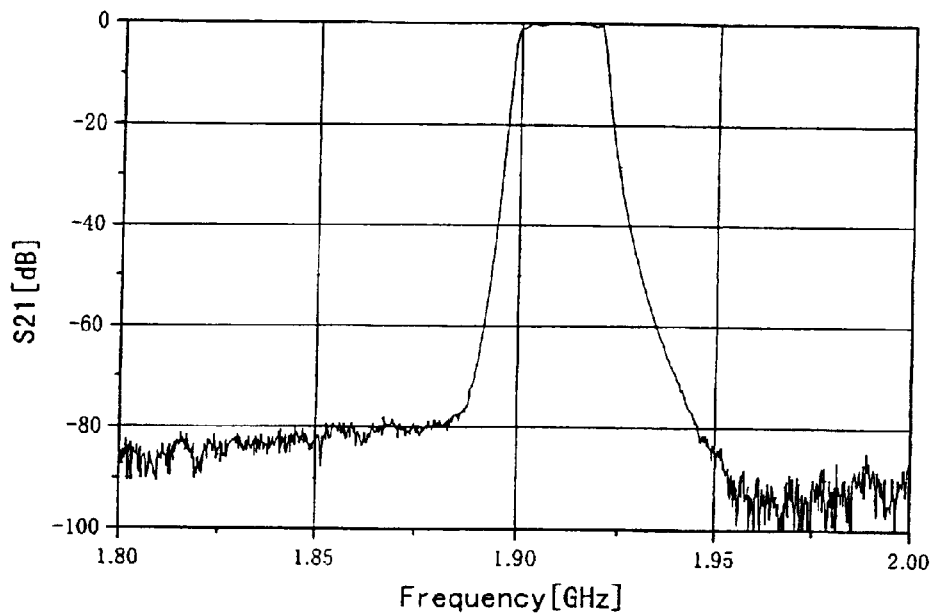
FIG. 3 is a graph showing a frequency characteristic of the high-frequency circuit element according to the first embodiment of the present invention.

The frequency characteristic of the high-frequency circuit element of this embodiment formed under the above-mentioned conditions was measured. FIG. 3 shows the resultant characteristic. Herein, the measurement was carried out under the cooling condition at the absolute temperature of 64 K As a comparative example, a high-frequency circuit element was formed under the same conditions as mentioned above except that the plates 1a–1c were not provided. The frequency characteristic was measured under the cooling condition at the absolute temperature of 64 K FIG. 4 shows the resultant characteristics.

Figure 4:
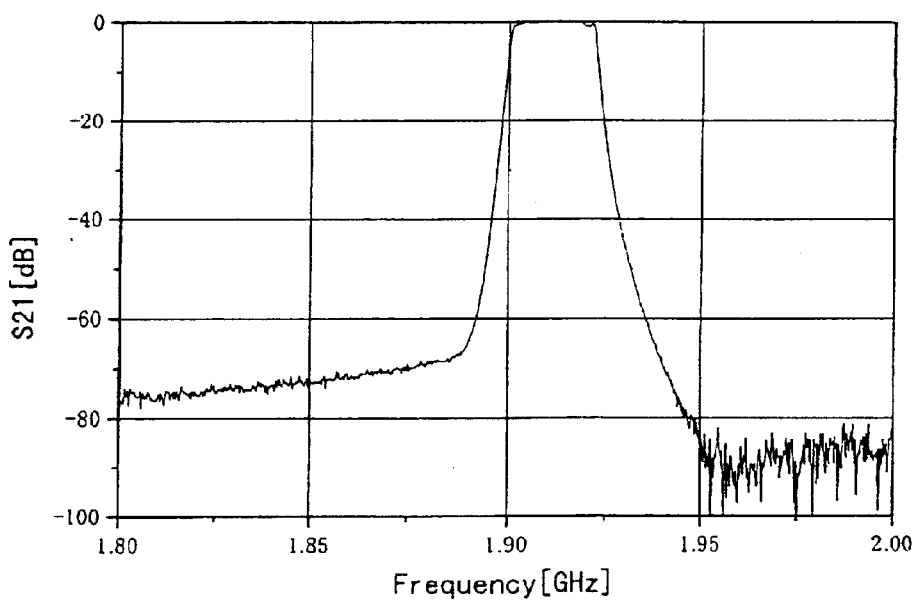
FIG. 4 is a graph showing a frequency characteristic of a high-frequency circuit element without a plate for interrupting an unwanted higher-order mode according to a comparative example of the present invention.

As is apparent from the comparison between FIG. 3 and FIG. 4, in the high-frequency circuit element of this embodiment, the attenuation in the rejection band was improved by about −10 dB, i.e., from the conventional values of about −70 dB to about −80 dB, by the effect of the plates 1a–1c. The result signifies that the capability of eliminating unwanted out-of-band signals as a filter was improved.

As mentioned above, in the high-frequency circuit element according to this embodiment, the frequency characteristic is improved by providing the plates 1a–1c.

In the above explanation, the plates 1a–1c were separately formed and fixed to the box frame 12 with conductive adhesive, etc. In place of the conductive adhesives, conductive screws may be used. Furthermore, it is not always necessary to fix the plates to the box frame 12. For example, the plates 1a–1c may be fixed to the box lid 11 with conductive adhesives or screws, and then be brought into a metallic contact with the box frame 12 to be electrically connected. Or it is possible to form the plates 1a–1c as one unit with the box.

Furthermore, the number and position of the plates, the shape and size of the cut-out, the thickness of the plate, and the optimum value such as the dielectric constant, etc. of materials may be different depending upon the structures of the high-frequency circuit and the box. Accordingly, the present invention is not necessarily limited to the configuration mentioned above. The above explanation referred to the configuration in which the space inside the rectangular parallelepiped box was approximately divided into three parts by using the plates for interrupting an unwanted higher-order mode. However, the present invention is not necessarily limited to this configuration. The improved frequency characteristic can be attained by any configuration as long as the connection portion (discontinuous portion) between the input/output terminal 14a and input/output line 17a and the connection portion (discontinuous portion) between the input/output terminal 14b and input/output line 17b are separated or divided so that each connection portion belongs to the different space, respectively.

Therefore, the number of the plates is not necessarily limited to three. Furthermore, the shape of the plate is not necessarily limited to the shape mentioned above. Also, the shape of the cut-out is not necessarily limited to a semicircular shape. It is possible to attain the same effect by employing, for example, a triangle shape, etc.

Furthermore, the material of the plate for interrupting an unwanted higher-order mode is not necessarily limited to a conductor material. Any materials can be used as long as they do not transmit electromagnetic waves. Therefore, a dielectric having the high dielectric constant capable of reflecting or absorbing electromagnetic waves may be used. It is possible to attain the same effect by using, for example, $LaAl_2O_3$ having a dielectric constant of 24, which is cut out similarly to the substrate.

Second Embodiment

Figure 5:
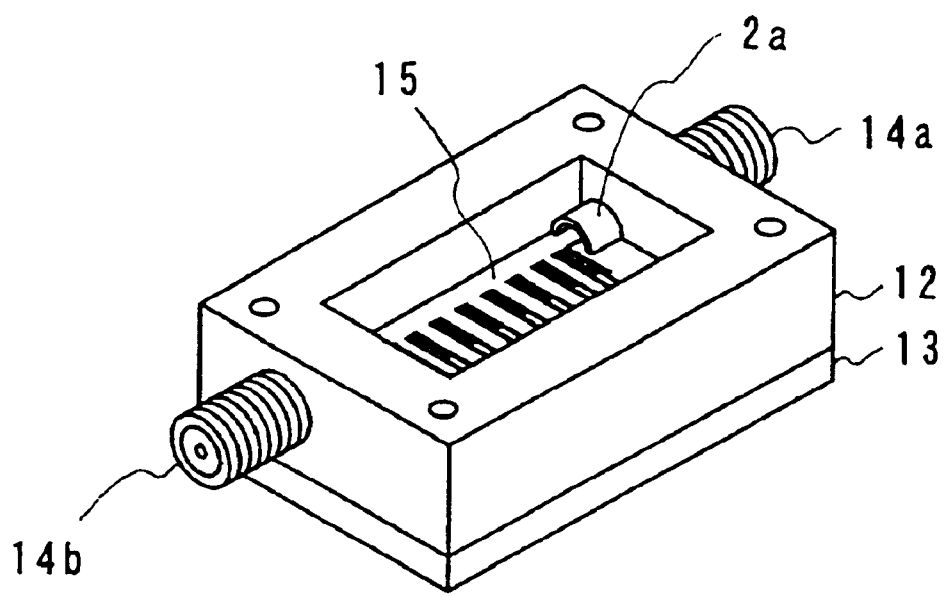
FIG. 5 is a perspective view showing a schematic structure of a high-frequency circuit element according to a second embodiment of the present invention.
Figure 6:
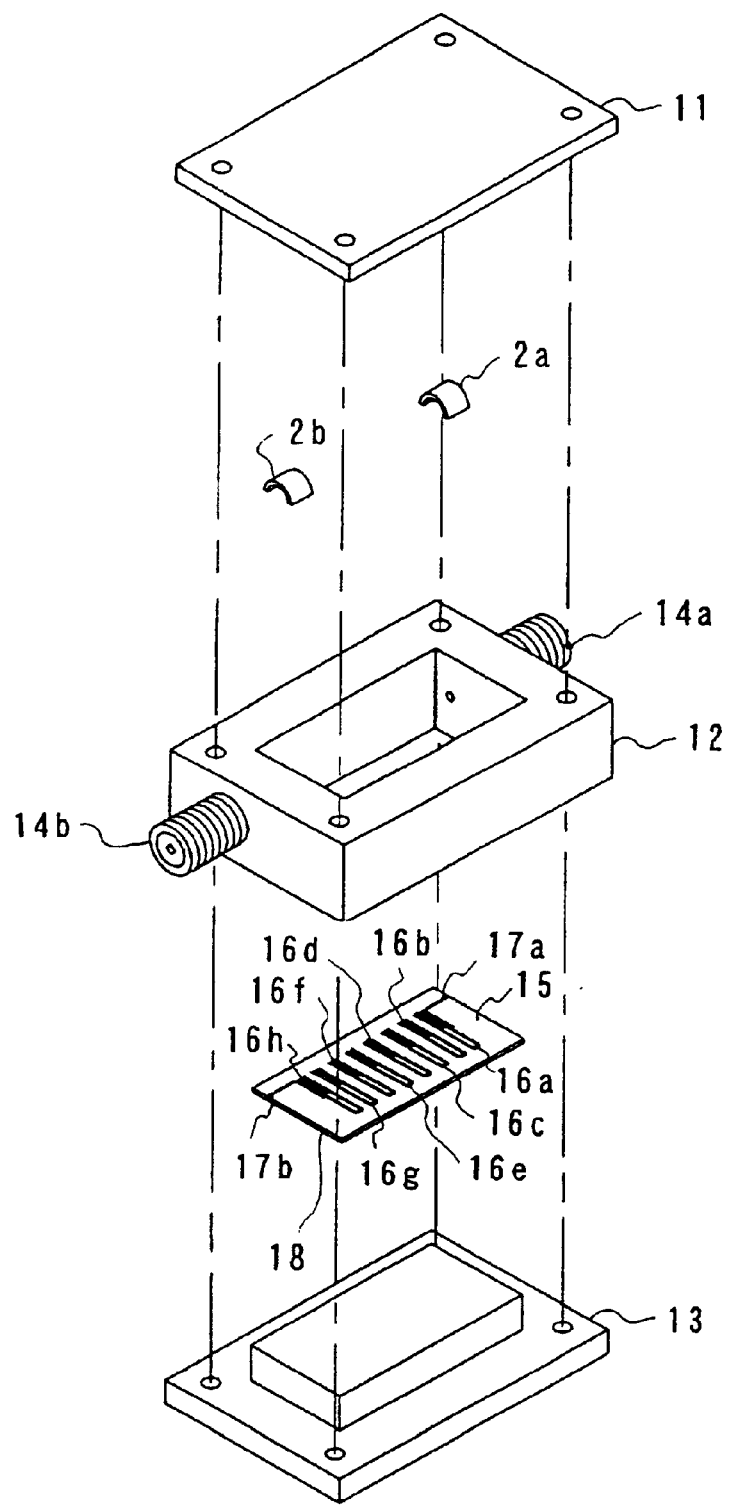
FIG. 6 is an exploded perspective view showing the high-frequency circuit element according to the second embodiment of the present invention.
Figure 7:
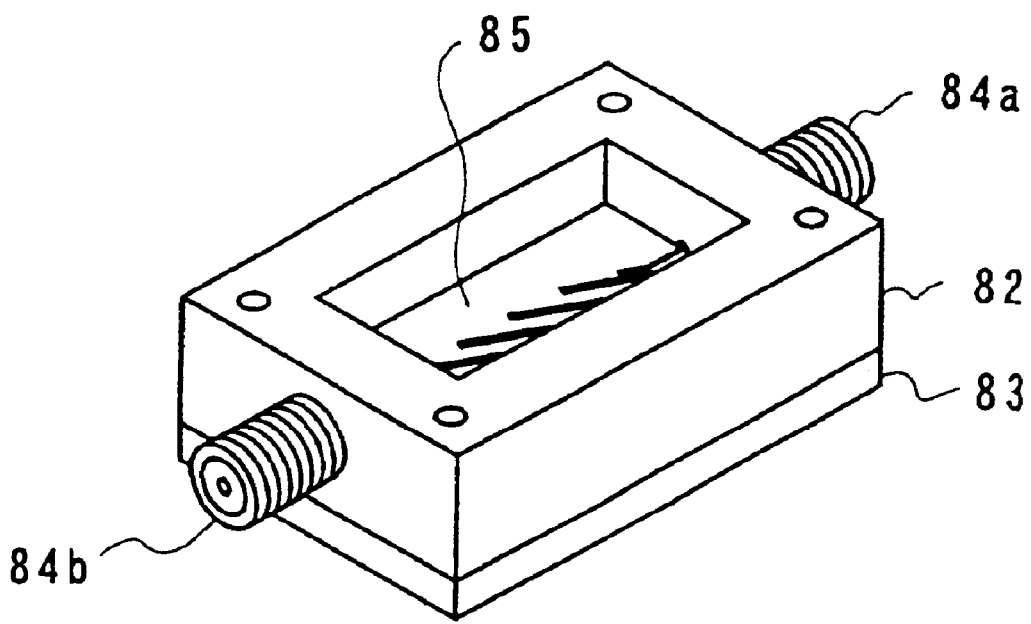
FIG. 7 is a perspective view showing a schematic structure of one example of a high-frequency circuit element according to a prior art.
Figure 8:
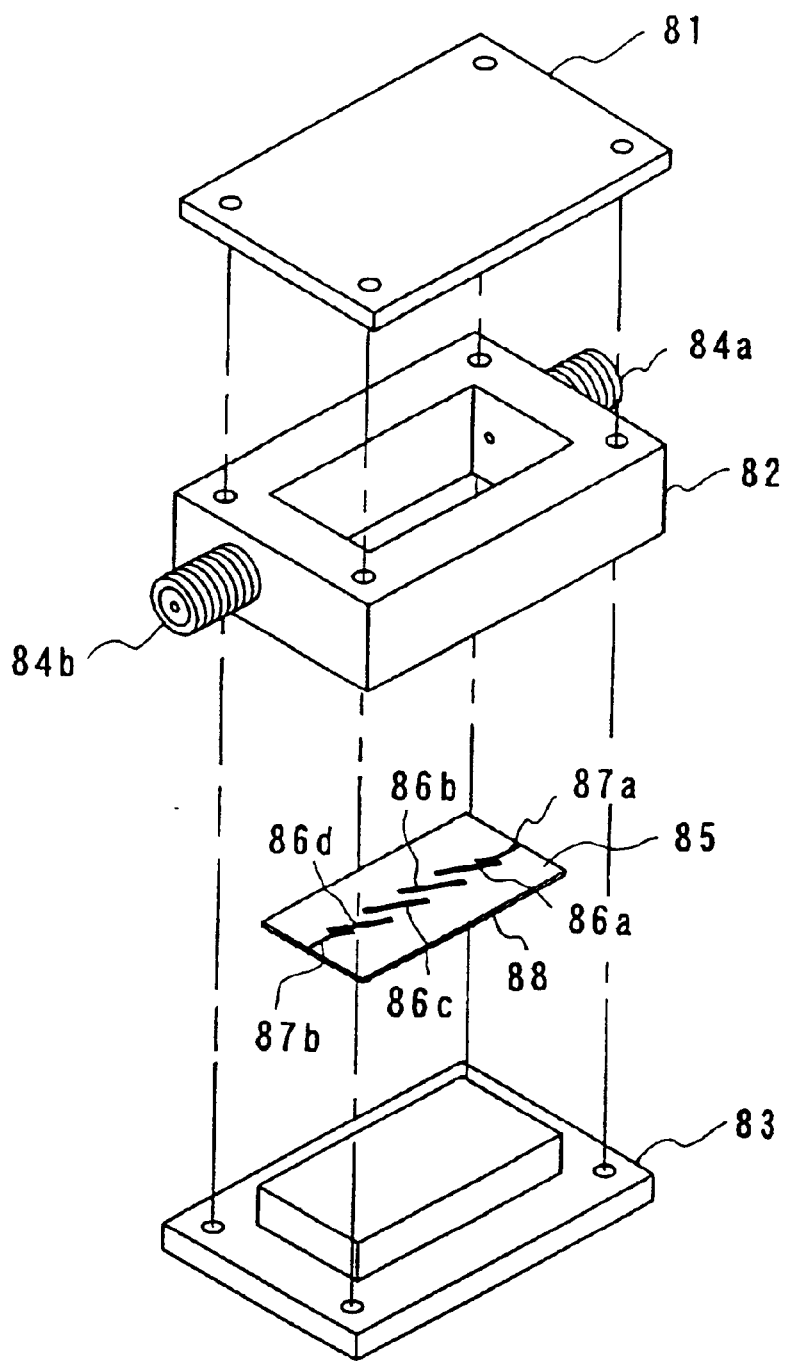
FIG. 8 is an exploded perspective view showing the high-frequency circuit element according to the prior art.
Figure 9:
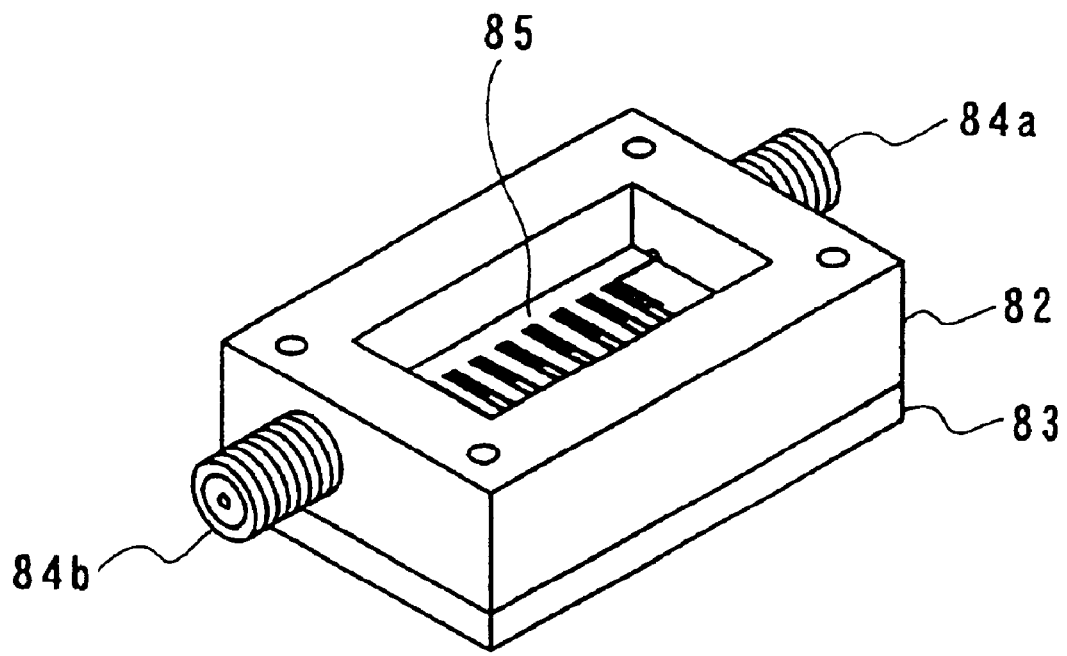
FIG. 9 is a perspective view schematically showing a structure of another example of a high-frequency circuit element according to a prior art.
Figure 10:
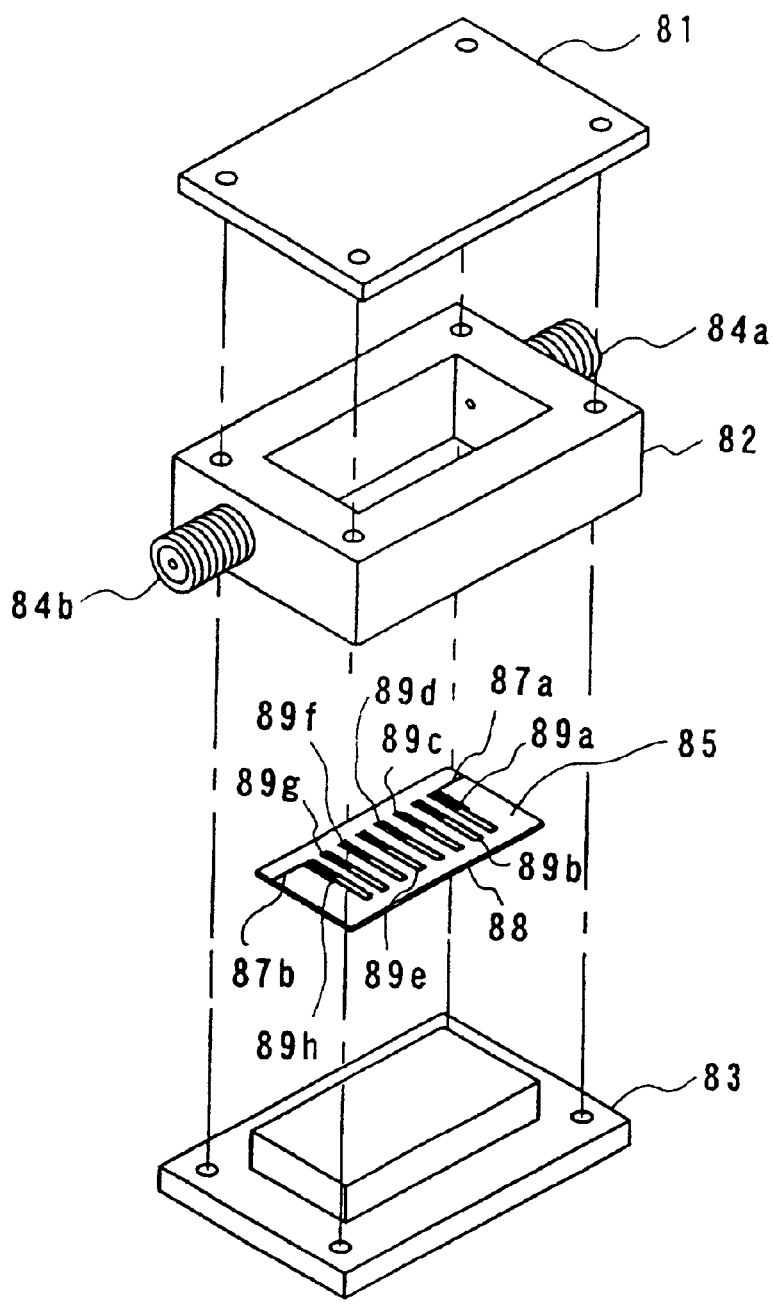
FIG. 10 is an exploded perspective view showing the high-frequency circuit element according to the prior art.

FIGS. 5 and 6 respectively show a schematic structure of a high-frequency circuit element according to another embodiment of the present invention. In FIG. 5, a box lid 11 shown in FIG. 6 is omitted so that the internal structure of the box can be seen.

The high-frequency circuit element of this embodiment has covers 2a, 2b for interrupting an unwanted higher-order mode made of a conductor material as shown in FIG. 6, instead of the plates 1a–1c for interrupting unwanted higher-order mode used in the high-frequency circuit element according to the first embodiment. The structures of the other parts are similar to those of the high-frequency circuit element according to the first embodiment shown in FIGS. 1 and 2 and so the explanations are not repeated.

The covers 2a, 2b have a semicircular shape and are placed so that they respectively cover the input/output lines 17a, 17b on the substrate 15. And the covers 2a, 2b are respectively fixed to the inner surface of the box frame 12, on which the input/output terminals 14a, 14b are respectively connected, with, for example, conductive adhesives so that the covers 2a, 2b are electrically connected to the box.

The high-frequency circuit element of this embodiment is the same as that of the first embodiment in that the hairpin resonators 16a–16h function as band pass filters. Also in the high-frequency circuit element of this embodiment, it is necessary to prevent the generation of a waveguide mode (see FIG. 12), which is one of the unwanted higher-order modes other than the fundamental mode and which propagates through the box as a rectangular waveguide. Such a waveguide mode is generated due to the radiation of electromagnetic waves excited by the conversion of the propagation mode during the transmission from the input/output terminal 14a to the input/output line 17a, or due to the radiation of electromagnetic waves from the microstrip conductor, i.e., hairpin resonators 16a–16h.

In the high-frequency circuit element of this embodiment, when the input/output terminal 14a is an input side and the input/output terminal 14b is an output side, the cover 2a provided so as to cover the input/output line 17a, has an effect of suppressing the dissipation of electromagnetic waves in a higher-order mode excited by the conversion of the propagation mode caused during the transmission from the input/output terminal 14a to the input/output terminal 17a.

Furthermore, the cover 2b provided so as to cover the input/output line 17b, has an effect of suppressing the higher-mode electromagnetic waves excited by the radiation from the hairpin resonators 16a–16h that are a microstrip conductor from entering the input/output line 17b.

According to the configuration mentioned above, it is possible to suppress the propagation of signals due to the unwanted higher-order mode and thus to prevent the deterioration of the out-of-band characteristic of the filter.

For example, the high-frequency circuit element was produced under the same conditions as those of the comparative example shown in the first embodiments, namely, for example, the same materials, the-same shape and the same size of the substrate 15, hairpin resonator 16a–16h, the box lid 11, the box frame 12, the box bottom 13, and the input/output terminals 14a, 14b were employed as the first embodiment, and the covers 2a, 2b were formed in a half cylinder shape having an inner diameter of 4 mm, a thickness of 0.5 mm, and a length of 3 mm by mechanically processing brass. When the frequency characteristic of the thus produced high frequency circuit element was measured, the same results as those of FIG. 3 were attained.

When the frequency characteristic of the high-frequency circuit element of this embodiment was compared with that shown as a comparative example in FIG. 4 without having the covers 2a, 2b, the attenuation of the rejection band is improved by about −10 dB. The result signifies that the capability of eliminating out-of-band unwanted signals was improved.

Thus, the high-frequency circuit element of this embodiment improves the frequency characteristic by providing the covers 2a, 2b.

Furthermore, it is preferable that the covers 2a, 2b are formed of a dielectric having high dielectric constant. According to such a preferred embodiment, electromagnetic waves are reflected from or absorbed by the dielectric and cannot pass through the covers 2a, 2b, thus improving the effect of suppressing the propagation of the unwanted higher-order mode. As the dielectric constant is higher, the reflection coefficient increases and the effect is improved. It is particularly preferable that when the dielectric having a high dielectric constant of about 10 or more is used, the reflection coefficient on the dielectric boundary is about 0.5 or more and the significant effect can be attained.

In the above explanation, the covers 2a, 2b are produced separately and fixed to the box. However, the present invention is not necessarily limited to this configuration. It is also possible to form the covers as one unit with the box. Furthermore, for the shape, semicircular structure is herein employed. However, it is possible to attain the same effect by using a cover having other shapes. Examples of the other shaped cover include a cover having a rectangular U-shaped cross section.

Furthermore, the shape and size of the cover for interrupting an unwanted higher-order mode, the optimum value such as the dielectric constant, etc. of materials, may be different depending upon the structures of the high-frequency circuit and the box. Accordingly, the present invention is not necessarily limited to the configuration mentioned above.

Furthermore, while in each of the above-mentioned embodiments, the high-frequency circuit element having a high-frequency circuit of a strip conductor pattern including a plurality of coupled hairpin resonators are explained, the high-frequency circuit is not necessarily limited to the strip conductor pattern. It is possible to attain the same effect by using circuit structure based on other resonator structures, for example, $\lambda/2$ resonator, etc.

The structure of the high-frequency circuit is not necessarily limited to the microstrip structure, and it is possible to attain the same effect by using other planar circuit structure such as a coplanar structure etc., microwave semiconductor integrated circuit structure, or the like. Furthermore, the structure of the high-frequency circuit is not necessarily limited to the filter of resonator, and it is possible to attain the same effect by using other high frequency circuit, for example, an amplifier, an isolator, etc.

As mentioned above, in the high-frequency circuit element according to the present invention, by providing a plate or cover for interrupting an unwanted higher-order mode, it is possible to suppress the excitation and propagation of the unwanted higher order mode such as a waveguide mode, etc., generated in the space inside the box. Therefore, it is possible to provide a high performance high-frequency circuit element which has an excellent frequency characteristic and which is less deteriorated due to the unwanted higher-order mode.

Furthermore, the function of suppressing excitation and propagation of the unwanted higher-order mode becomes effective even under the severe conditions in which operation frequency is higher, low loss conductor materials are used for the conductor material of the high frequency circuit, or the like. Therefore, the high-frequency circuit element according to the present invention can function in super high frequency wave such as a millimeter wave. In this case, a high-frequency circuit element having lower loss can be realized.

The invention may be embodied in other specific forms without departing from the spirit or essential characteristics thereof The embodiments disclosed in this application are to be considered in all respects as illustrative and not restrictive, the scope of the invention being indicated by the appended claims rather than by the foregoing description, all changes that come within the meaning and range of equivalency of the claims are intended to be embraced therein.

What is claimed is:

1. A high-frequency circuit element comprising:

a substrate, a high-frequency circuit having input/output lines disposed on said substrate, a metal box with a lid electromagnetically shielding said high-frequency circuit by enclosing said substrate therewithin, input/output terminals placed on said metal box and inputting/outputting a high-frequency signal to/from said high-frequency circuit, said input/output terminals being connected to respective input/output lines of said high-frequency circuit, and covers for interrupting an unwanted higher order mode, surrounding the input/output lines and connecting portions between the input/output lines and the respective input/output terminals, respectively, within an internal space of said metal box so as to separate a region around one of the input/output lines from another region around another of said input/output lines and thereby suppress the propagation of high-frequency waves.

2. The high-frequency circuit element according to claim 1, wherein said covers for interrupting an unwanted higher-order mode are comprised of a conductor.

3. The high-frequency circuit element according to claim 2, wherein said covers for interrupting an unwanted higher-order mode are electrically connected to said metal box.

4. The high-frequency circuit element according to claim 1, wherein said covers for interrupting an unwanted higher-order mode are comprised of a dielectric having a high dielectric constant.

5. The high-frequency circuit element according to claim 1, wherein said high-frequency circuit is a high-frequency filter.

6. The high-frequency circuit element according to claim 5, wherein said high-frequency filter has a plurality of coupled planar circuit resonators.

7. The high-frequency circuit element according to claim 1, wherein said high-frequency circuit is a superconductive high-frequency filter.

8. A high-frequency circuit element comprising:

a substrate, a high-frequency circuit disposed on said substrate, a metal box electromagnetically shielding said high-frequency circuit by enclosing said substrate therewithin, input/output terminals placed on said metal box and inputting/outputting a high-frequency signal to/from said high-frequency circuit, said input/output terminals being connected at a connection portion to respective input/output lines of said high-frequency circuit, and a plate, for interrupting an unwanted higher-order mode, placed spanning over and approximately perpendicular to at least one input/output line of said high-frequency circuit so as not to be in contact electrically with said input/output line and so as to isolate said connection portion from said high-frequency circuit, thereby cutting off the propagation path for the high-frequency waves in the internal space of said metal box.

9. The high-frequency circuit element according to claim 8, wherein said plate for interrupting an unwanted higher-order mode comprises a dielectric having a high dielectric constant.

10. The high-frequency circuit element according to claim 8, wherein said high-frequency circuit is a superconductive high-frequency filter.

11. The high-frequency circuit element according to claim 8, wherein said plate for interrupting an unwanted higher-order mode has a cut-out so that said plate is not in an electric contact with said high-frequency circuit.

* * * * *

UNITED STATES PATENT AND TRADEMARK OFFICE
CERTIFICATE OF CORRECTION

PATENT NO.   : 6,741,142 B1
DATED        : May 25, 2004
INVENTOR(S)  : Okazaki et al.

It is certified that error appears in the above-identified patent and that said Letters Patent is hereby corrected as shown below:

Title page,
Item [56], References Cited, FOREIGN PATENT DOCUMENTS, "JP 263702" should read -- JP 265702 --

Signed and Sealed this

Nineteenth Day of April, 2005

JON W. DUDAS
*Director of the United States Patent and Trademark Office*